United States Patent
Denison

(10) Patent No.: US 7,098,644 B1
(45) Date of Patent: Aug. 29, 2006

(54) NON-CONTACT HIGH-VOLTAGE ELECTROMETER ARCHITECTURE WITH LOW-VOLTAGE FEEDBACK

(75) Inventor: Timothy J. Denison, Minneapolis, MN (US)

(73) Assignee: Analog Devices, Inc., Norwood, MA (US)

( * ) Notice: Subject to any disclaimer, the term of this patent is extended or adjusted under 35 U.S.C. 154(b) by 0 days.

(21) Appl. No.: 11/086,976

(22) Filed: Mar. 22, 2005

Related U.S. Application Data

(60) Provisional application No. 60/555,233, filed on Mar. 22, 2004.

(51) Int. Cl.
- G01R 31/02 (2006.01)
- G01R 29/12 (2006.01)
- G01R 27/26 (2006.01)

(52) U.S. Cl. .................. 324/72.5; 324/458; 324/658
(58) Field of Classification Search ............... 324/72, 324/72.5, 457, 99 D, 458, 658
See application file for complete search history.

(56) References Cited

U.S. PATENT DOCUMENTS

| | | | | |
|---|---|---|---|---|
| 3,873,919 | A * | 3/1975 | Vosteen | 324/72 |
| 4,106,869 | A * | 8/1978 | Buchheit | 399/73 |
| 4,797,620 | A * | 1/1989 | Williams | 324/458 |
| 5,323,115 | A | 6/1994 | Werner, Jr. | 324/457 |
| 5,517,123 | A | 5/1996 | Zhao et al. | 324/458 |
| 6,008,653 | A * | 12/1999 | Popovic et al. | 324/456 |
| 6,257,061 | B1 * | 7/2001 | Nonoyama et al. | 73/514.32 |
| 6,411,108 | B1 * | 6/2002 | Douglas et al. | 324/658 |
| 6,806,717 | B1 | 10/2004 | Werner, Jr. et al. | 324/458 |

OTHER PUBLICATIONS

Lion, *Instrumentation in Scientific Research*, McGraw-Hill, 1959, pp. 1-324.
Loconto, *High-Sensitivity Micromechanical Electrostatic Voltmeter*, M.S. Thesis submitted to the Department of Electrical Engineering and Computer Sciences, University of California at Berkeley, Dec. 1992, pp. 1-100.
Noras, *AC-Feedback Electrostatic Voltmeter Operation*, Trek, Inc., Trek Application Note No. 3006, 0803/MAN Rev. 0b, 2003, pp. 1-4.
Riehl, *Micromachined Resonant Electrometer*, M.S. Thesis submitted to the Department of Electrical Engineering and Computer Sciences, University of California at Berkeley, Fall 1999, pp. 1-90.
Riehl et al. *Electrostatic Charge and Field Sensors Based on Micromechanical Resonators*, Journal of Microelectromechanical Systems, vol. 12, No. 5, Oct. 2003, pp. 577-589.
Loconto et al. *Sensitive, High—Impedance Micromechanical Electrostatic Voltmeter, Transducers '93, 7th Intern. Conference on Sensors and Actuators*, sponsored by IEE Japan and the Japan Science Foundation, Tech. Digest 878-81, Yokohama, Japan, Jun. 7-10, 1993.

* cited by examiner

Primary Examiner—Anjan Deb
Assistant Examiner—Jeff Natalini
(74) Attorney, Agent, or Firm—Bromberg & Sunstein LLP

(57) ABSTRACT

A voltmeter measures an unknown voltage on a target surface using multiple sampling stages or a parallel reference capacitor. A movable shutter may alternately be closed during resetting of a voltage measuring circuit and opened so as to expose a detector plate to the target surface during two sampling stages. Alternatively, the shutter may be used to modulate exposure of a detector plate to the target surface.

19 Claims, 7 Drawing Sheets

NON-CONTACT HIGH-VOLTAGE ELECTROMETER ARCHITECTURE WITH LOW-VOLTAGE FEEDBACK

PRIORITY

This application claims priority from U.S. Provisional Patent Application No. 60/555,233 entitled Non-contact, High-voltage Electrometer Architecture with Low-voltage Feedback, filed on Mar. 22, 2004 in the name of Timothy J. Denison, which is hereby incorporated herein by reference in its entirety.

FIELD OF THE INVENTION

The invention generally relates to voltmeters, and, more particularly, to non-contact voltmeters that measure a voltage on a target surface without touching the target surface.

BACKGROUND OF THE INVENTION

Non-contact measurement of a target surface's potential relies on the detection of an electric field. As discussed in D. P. Loconto, *High-sensitivity Micromechanical Electrostatic Voltmeter*, M. S. Thesis, UC Berkeley EECS, 1992 and R. D. Houston, *Non-contacting ESV Technology*, Xerox Corporation Internal Report, Rochester, N.Y., March 1983, both of which are hereby incorporated herein by reference in their entireties, the measurement of electric field strength can be made by cutting the electric field lines between the target surface and an on-chip sense-plate conductor. Together, the target surface and the sense plate form a parallel-plate capacitor structure, denoted as the sense capacitance. A third conductor, the shutter, is held at the same potential as the sense plate and swept across the sense-plate. The shutter's motion serves to modulate the effective area of the sense capacitance relative to the target surface. The varying coupling capacitance results in a dynamic current, proportional to the electric field between the target and the sense plate, that is conditioned by on-chip circuitry.

Features of modern MEMS processing, such as Analog Device's iMEMS3 process, allow for the design and manufacture of a high-performance field-mill. Referring to FIG. 2, the MEMS processing provides direct connection between the interface circuit and the key MEMS structures. The direct connection between the circuit and the shutter reduces parasitic capacitance, which improves the signal-to-noise ratio of the device. In addition, co-integration of the MEMS and the circuitry provides high reliability, as demonstrated by the sub-ppm field failure rate of automotive sensors. The two poly layers underneath the sensor provide suitable conducting paths for interconnect and the field-mill sense plate, while the top mechanical poly layer is free to move and provide the mechanical shutter. The composite system architecture is illustrated in FIG. 3.

Non-Contact Voltmeter Measurement Principle: Servo Loop #1

The iMEMS3 field-mill allows for single-chip implementation of a non-contact voltmeter. The simple field mill architecture, however, can suffer from sensitivity to environmental fluctuations. Examples of these potential error sources include gap variations between the MEMS transducer and the target surface, and variations in the absolute shutter motion due to process and temperature variation. To correct for these variations, the field mill may be placed within a global feedback loop to form a true voltmeter, for example, as discussed in K. S. Lion, *Instrumentation in Scientific Research*, McGraw-Hill, 1959, which is hereby incorporated herein by reference in its entirety. The function of the feedback loop is to adjust the supply reference for the MEMS transducer until it is equal to the unknown target surface potential. When the target, shutter and sense plate are at equal potentials, the motion of the shutter no longer induces a modulation signal and the loop is balanced. The architecture for this instrument is illustrated in FIG. 4. Note that for large target potentials, the bootstrap voltage must be created from a "boost" converter or a regulated high-voltage power supply. The need for a high-voltage bootstrap creates significant system complexity and cost.

Non-Contact Voltmeter Measurement Principle: Servo Loop #2

A low-voltage feedback strategy can be achieved by local charge cancellation of the induced field-mill charge. One basis for this servo strategy is to superimpose an AC feedback signal onto the summing node of the interface amplifier. Once again we start with a modulating field-mill capacitor Cm, which creates a current equal to $Vs(dCm/dt)$ at the summing node (Vs is the potential difference between the target and detector). As illustrated in subfigure 2 in FIG. 5, a time varying signal (Vg) is supplied to the summing node reference, which reacts with the static capacitance (Co) to create a current modulation equal to $Co(dVg/dt)$. Note that this signal is proportional to the nominal gap between the target surface and the detector, just like Cm. If we then close a servo loop by adjusting the AC voltage applied to the summing node (subfigure 3) to cancel the net current, we achieve a net signal at the output of $Vout=Vs*(Cm/Co)$, assuming the frequency and phase of the field-mill and AC signal are matched. This technique relies on the modulation capacitance to be significantly smaller than Co, and U.S. Pat. No. 4,797,620, which is hereby incorporated herein by reference in its entirety, clearly states this can be achieved with gap modulation between the target and the detector. Assuming this is the case, the transfer function for the detector reduces to $Vout=(Delta)/go*Vs$, where (Delta) is the modulation length, and go is the nominal gap.

This voltmeter architecture suffers from several drawbacks. First, the ratio of (Delta)/go is not really a systematic constant and restricts the accuracy and/or range of the part. Although sufficient spacing between the detector and the target surface can limit sensitivity variations to under 1%, this accuracy comes at the expense of resolution due to noise and susceptibility to external field perturbations. An additional drawback of this architecture is that it is limited to gap modulation in the direction of the target surface. In a MEMS device, significant lateral motion is generally easier to achieve than vertical motion, and this architecture will therefore be difficult to implement effectively. In addition to mechanical constraints, the servo architecture does not lend itself to a lateral implementation for key electrical reasons. Notably, to achieve acceptable attenuation of the high voltage signal, the ratio between the reference capacitance Co and the modulation capacitance Cm must be large. This cannot be achieved with a single lateral plate, where Co and Cm are effectively the same.

SUMMARY OF THE INVENTION

Various embodiments of the invention relate to a non-contact voltmeter that measures high-voltage potentials on a target surface with a combination of low-voltage circuitry and MEMS devices. Non-contact metrology has many applications, but is particularly important to the field of xerography and laser printing, where non-contact voltmeters allow for precision measurement and control of the imaging drum's potential. One significant issue associated with existing non-contact voltmeter architectures is the sensitivity of the measurement to variations in the sensor-to-target surface spacing, which makes in-line trim difficult. The spacing sensitivity can be addressed, however, by employing a servo loop. Existing servo architectures, however, require either hybrid high-voltage circuitry that is expensive and bulky, or the use of fairly complicated "ac feedback" techniques that do not fully decouple the gap variation from the measurement accuracy. The architecture described herein allows for full decoupling of the gap and environmental variations while employing only low-voltage devices. When implemented in an integrated MEMS process technology, for example, this architecture allows for significant reduction in electrometer cost while maintaining the accuracy of existing high-end commercial instruments.

In accordance with one aspect of the invention there is provided a voltmeter for measuring an unknown voltage Vs on a target surface without contacting the target surface. The voltmeter includes a voltage measuring circuit having a detector plate forming a capacitance Cm with the target surface and a movable shutter for selectively exposing the detector plate to the target surface. The voltage measuring circuit (1) measures, in a first sampling stage, a charge Vs*B, where B is proportional to Cm; (2) measures, in a second sampling stage, a charge Vp*B, where Vp is a known voltage introduced by the voltage measuring circuit; (3) determines the value B based on the known voltage Vp; and (4) determined the value Vs based on the determined value B.

The voltage measuring circuit may also include a voltage source having a voltage Vp; a charge amplifier having a first input coupled to the detector plate, a second input that can be selectively coupled to either a ground or a reference voltage source, and an output; a reference capacitor having a capacitance Cf coupled between the first input of the charge amplifier and the output of the charge amplifier; a difference amplifier having a first input coupled to the output of the charge amplifier, a second input coupled to the voltage source, and an output; and a controller coupled to the output of the charge amplifier, the output of the difference amplifier, and the shutter. In a first sampling stage, with the shutter in a closed position substantially blocking the detector plate from the target surface, the voltage measuring circuit reset, and the second charge amplifier input switched to ground, the controller causes the shutter to be moved into an opened position exposing the detector plate to the target surface and measures the output Vo of the charge amplifier, which is equal Vs*Cm/Cf. In a second sampling stage, with the shutter still in the opened position, the reference capacitor reset, and the second charge amplifier input switched to the voltage source, the controller measures the output Vy of the difference amplifier, which is equal to Vp*Cm/Cf. The controller determines the quantity Cm/Cf based on Vy and the known quantity Vp and determines the value of Vs based on Vo and the determined quantity Cm/Cf.

In a typical embodiment, the shutter and the detector plate are formed on a common substrate. The controller typically includes a sample-and-hold or equivalent circuit for measuring and storing Vo. In certain embodiments, the voltage source produces a DC voltage. In other embodiments, the voltage source produces an AC voltage, in which case the controller typically includes a demodulator to demodulate the varying signal output by the difference amplifier during the second sampling stage.

The voltage measuring circuit may also include a reset switch coupled in parallel with the reference capacitor. The controller typically resets the reference capacitor using the reset switch before exposing the detector plate to the target surface and also resets the reference capacitor using the reset switch between the first and second sampling stages.

In accordance with another aspect of the invention there is provided a method for measuring an unknown voltage Vs on a target surface. The method involves exposing a detector plate with an equivalent capacitance of Cm to the target surface; measuring a charge Vs*B using the detector plate, where B is proportional to Cm; measuring a charge Vp*B, where Vp is a known voltage; determining the value of B based on the known voltage Vp; and determining the value of Vs based on the determined value B.

Measuring the charge Vs*B may involve measuring the induced charge on the detector plate relative to a reference capacitor Cf and ground to obtain a voltage Vo equal to Vs*Cm/Cf. Measuring the charge Vp*B may involve measuring the charge on the detector plate relative to the reference capacitor and a known voltage Vp to obtain a voltage Vy equal to Vp*Cm/Cf. Exposing the detector plate to the target surface typically involves retracting a shutter from between the detector plate and the target surface. The shutter and the detector plate may be formed on a common substrate. Measuring the charge on the detector plate to obtain the voltage Vy may involve measuring the charge on the detector plate relative to the reference capacitor and the known voltage Vp to obtain an intermediate voltage Vx equal to Vp+Vp*Cm/Cf and subtracting the known voltage Vp from the voltage Vx to obtain Vy.

In accordance with another aspect of the invention there is provided a voltmeter for measuring an unknown voltage Vs on a target surface without contacting the target surface. The voltmeter includes a voltage measuring circuit having a first detector plate forming a capacitance Cm with the target surface and a second detector plate forming a capacitance N*Cm with the target surface and a movable shutter for modulating exposure of the first detector plate to the target surface. The voltage measuring circuit includes a nominal modulation capacitance circuit for measuring a first charge proportional to Vs*dCm/dt using the first detector plate; a parallel capacitance circuit for measuring a second charge proportional to N*Cm*dVp/dt using the second detector plate, where Vp is a known voltage modulated in phase and frequency with the modulated exposure of the first detector plate; a comparison circuit for comparing the first and second charges; and a controller for adjusting the magnitude of Vp based on the comparison circuit until the first and second charges are equal and determining Vs based on the voltage Vp.

The nominal modulation capacitance circuit may also include a first reference resistor or capacitor and a first charge amplifier, the first detector plate coupled to one input of the first charge amplifier, the first reference resistor coupled in parallel to the charge amplifier between said one input of the first charge amplifier and an output of the first charge amplifier, and another input of the first charge amplifier tied to ground. The parallel capacitance circuit may also include a second reference resistor or capacitor, a second charge amplifier, a voltage source (Vp), and a first difference amplifier, the second detector plate coupled to one input of the second charge amplifier, the second reference resistor coupled in parallel to the second charge amplifier between said one input of the second charge amplifier and output of the second charge amplifier, another input of the second charge amplifier tied to the voltage source, and the first difference amplifier coupled to receive as inputs the output of the second charge amplifier and the voltage source. The comparison circuit may include a second difference amplifier having a first input coupled to the output of the first charge amplifier and a second input coupled to the output of the first difference amplifier. The voltmeter also includes a controller coupled to the nominal modulation capacitance circuit, the parallel reference capacitance circuit, and the difference amplifier. The controller causes the shutter to be modulated at a predetermined frequency such that the output of the first charge amplifier is equal to $R*Vs*dCm/dt$. The controller causes the voltage source to output a predetermined voltage Vp in phase and frequency with the modulation of the shutter such that the output of the first difference amplifier is equal to $R*N*Cm*dVp/dt$ and the output of the second difference amplifier is equal to the difference between the values $R*Vs*dCm/dt$ and $R*N*Cm*dVp/dt$. The controller adjusts the magnitude of the voltage source until the output of the second difference amplifier is null and determines Vs based on the known quantities Vp and N, where Vs is equal to $Vp*N$.

The shutter and the detector plates may be formed on a common substrate.

BRIEF DESCRIPTION OF THE DRAWINGS

The foregoing and advantages of the invention will be appreciated more fully from the following further description thereof with reference to the accompanying drawings wherein.

DESCRIPTION OF ILLUSTRATIVE EMBODIMENTS

Shortcomings of existing non-contact voltmeter designs can be addressed with either of two improved servo architectures. The first architecture overcomes the shortcomings of a lateral field-mill's Co to Cm ratio by multi-sampling the detector capacitance during the sampling step. The second architecture fully eliminates the gap sensitivity by using a parallel reference capacitance Co that is significantly larger than the modulation capacitor. Both techniques improve on the state-of-the-art, allow for ease of MEMS integration, and allow use of only low-voltage electronics.

Improved Non-Contact Voltmeter Architecture #1: Multi-Sampling

In an exemplary multi-sampling architecture, a movable shutter is used to selectively expose a detector plate with an equivalent capacitance Cm to a target surface having an unknown voltage potential Vs. In one sample stage, a charge $Vs*B$ is measured, where B is proportional to Cm. In another sample stage, a charge $Vp*B$ is measured, where Vp is a known voltage. The value B is determined based on the known voltage Vp, and the value Vs is determined based on B.

Figure 1:
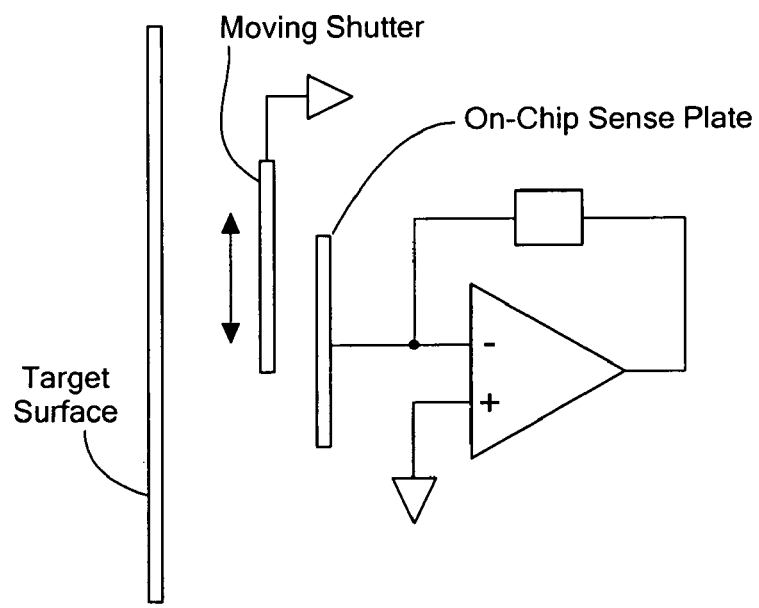
FIG. 1 schematically shows a conceptual illustration of a field-mill.
Figure 2:
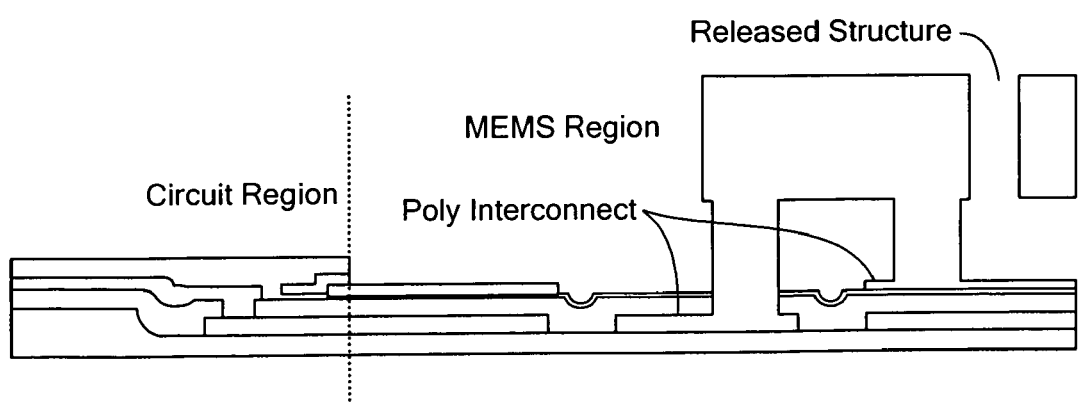
FIG. 2 is a cross-section of iMEMS3 process. The BiMOS circuit process interfaces on-chip with a triple stack of polysilicon. The two bottom layers are isolated from the substrate through a high-impedance dielectric stack and serve as fixed conductors. The top layer of polysilicon is released to allow for motion of the structure.
Figure 3:
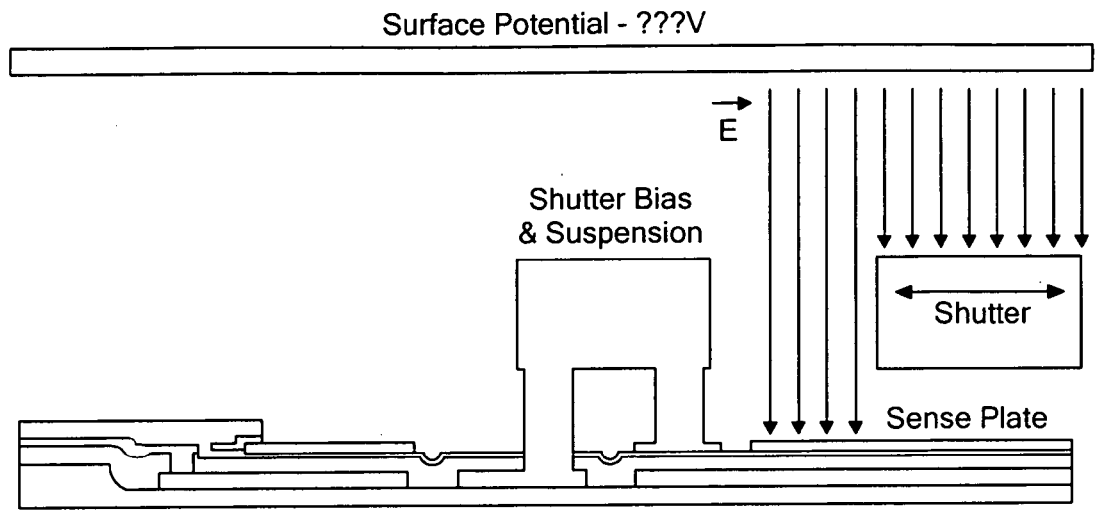
FIG. 3 schematically shows the field-mill transducer architecture with the iMEMS3 process.
Figure 4:
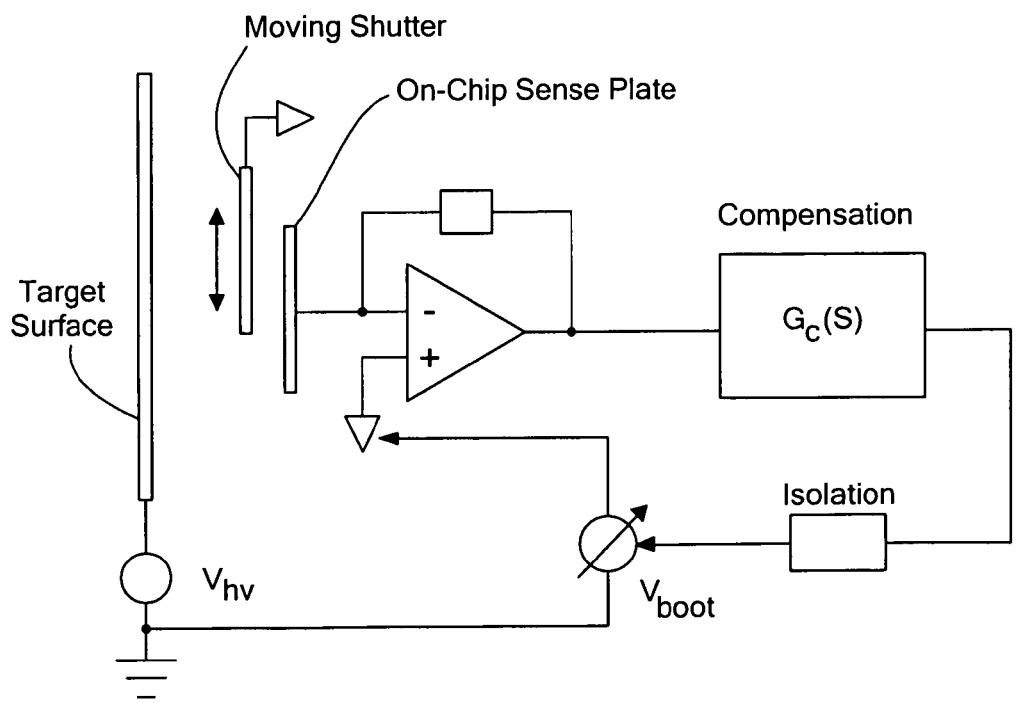
FIG. 4 schematically shows the system architecture for an improved non-contact voltmeter.
Figure 5A:
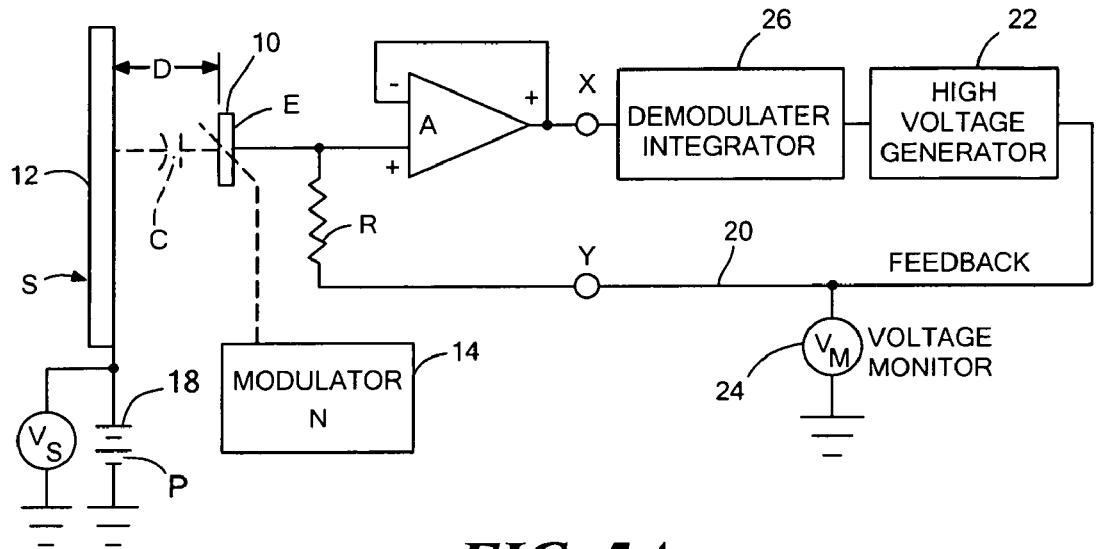
FIGS. 5A, 5B, and 5C show three prior art servo methods.
Figure 5B:
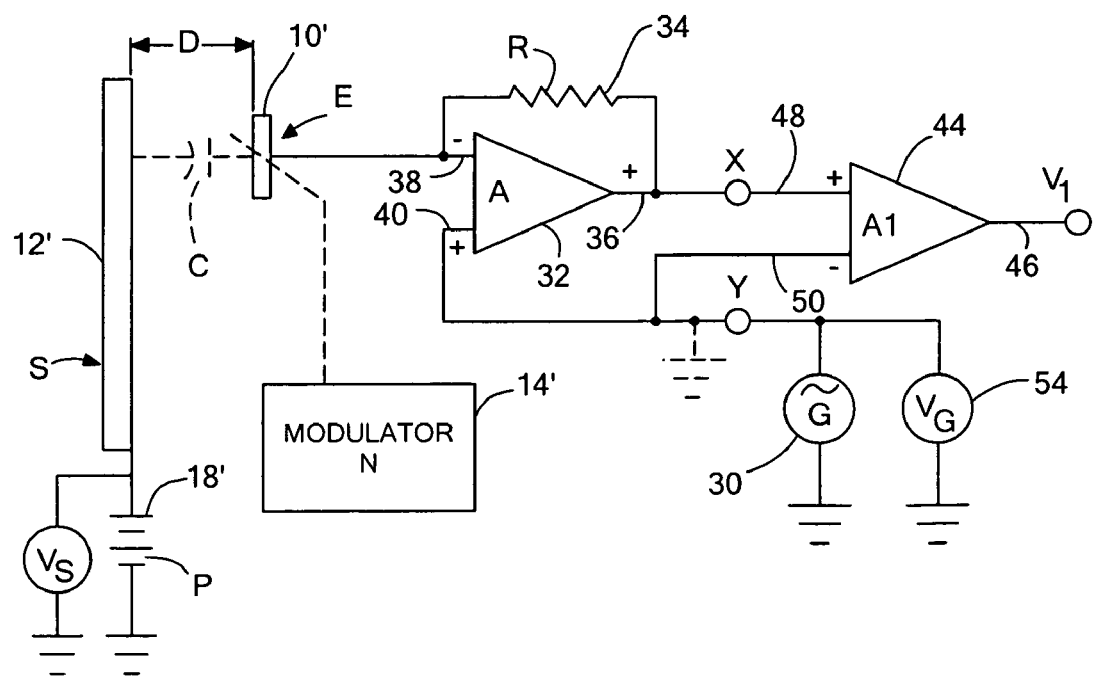
Figure 5C:
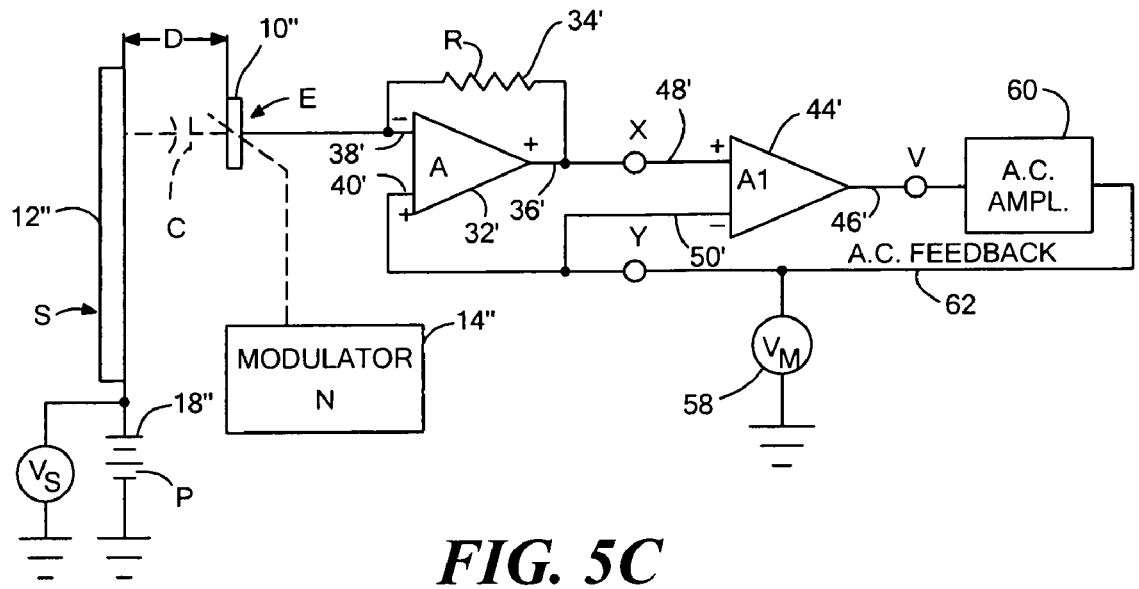
Figure 6:
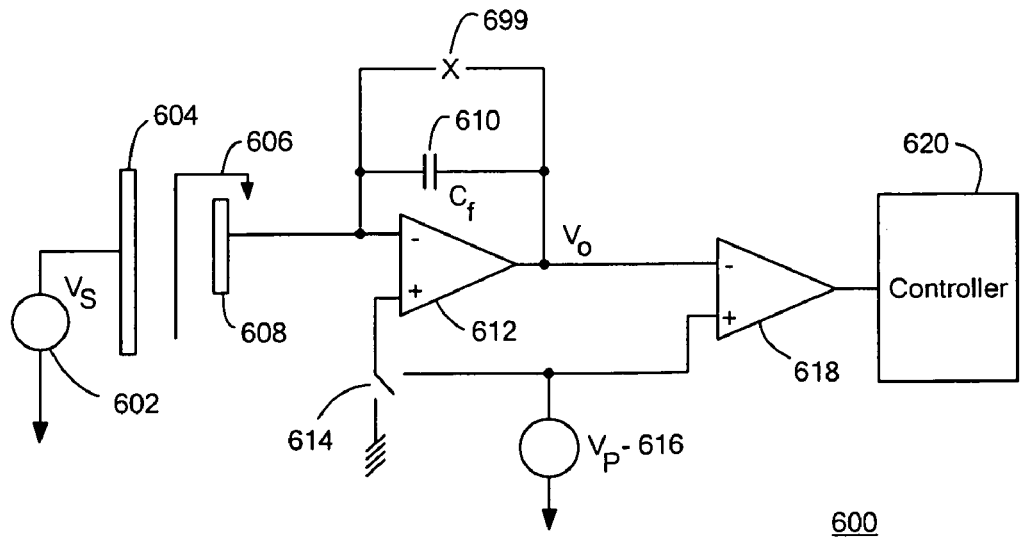
FIG. 6 is a schematic diagram showing the relevant components of an exemplary architecture for a multi-sampling non-contact voltmeter in accordance with an embodiment of the present invention.

FIG. 6 is a schematic diagram showing the relevant components of an exemplary architecture for a multi-sampling non-contact voltmeter 600 in accordance with an embodiment of the present invention. Among other things, the voltmeter 600 includes a movable shutter 606, a detector plate 608, a reference capacitor 610, a reset switch 699, a charge amplifier 612, a voltage source (Vp) 616, a difference amplifier 618, and a controller 620. The detector plate 608 is coupled to a first input of the charge amplifier 612. The reference capacitor 610 is coupled in parallel to the charge amplifier 612 between the first charge amplifier 5 input and the charge amplifier output, and the reset switch 699 is coupled in parallel with the reference capacitor 610 to allow resetting the reference capacitor 610 to null. A second charge amplifier input can be selectively switched between a ground 614 and the voltage source 616. The output of the charge amplifier 612 is coupled to a first input of the difference amplifier 618. A second input of the different amplifier 618 is coupled to the voltage source 616. The controller 620 is coupled to receive the output of the charge amplifier 612 as well as the output of the difference amplifier 618, among other things. The controller 620 also controls operation of the shutter, the switching of the second charge amplifier input between ground and the voltage source 616, and other elements of the device.

In order to measure a voltage (Vs) 602 on a target surface 604, the shutter 606 is initially placed in a closed position in which it blocks the detector plate 608 from exposure to the target surface 604, and the system is nulled using the reset switch 699. Then, with the second charge amplifier input switched to ground, the shutter 606 is pulled back, exposing the detector plate 606 with an equivalent capacitance of Cm to the target surface 604. The output (Vo) of the charge amplifier 612, which is equal to $Vs*Cm/Cf$, is stored by the controller 620, which includes a sample-and-hold or equivalent circuit. At this point, both Vs and Cm are unknown quantities. The reference capacitor 610 is then reset using the reset switch 699, and the second charge amplifier input is switched to the voltage source 616. The output (Vx) of the charge amplifier 612, which is equal to $Vp+Vp*Cm/Cf$, is fed into the difference amplifier 618, which subtracts Vp, resulting in an output (Vy) equal to $Vp*Cm/Cf$. The controller 620 receives the output of the difference amplifier 618 and determines therefrom the quantity Cm/Cf based on Vy and the known quantity Vp. The controller 620 then determines the value of Vs based on the stored voltage Vo and the determined quantity Cm/Cf.

It should be noted that this transfer function has no dependence on the physical geometry of the plates or the absolute modulation. This multi-sampling approach has the robust measurement characteristics of the high-voltage servo architecture, but can be achieved monolithically with a low-voltage MEMS process. To ensure the most robust measurement, the parasitic capacitance between the measurement plate and parasitic elements in the sensor system should also be driven with Vp.

It should also be noted that, in various embodiments of the invention, the voltage source (Vp) 616 can be a DC voltage or an AC voltage. If an AC voltage is used, the controller 620 typically includes a demodulator to compensate for the varying input voltage.

It should also be noted that this architecture is self calibrating in that neither Cm nor Cf need to be known a priori.

Figure 7:
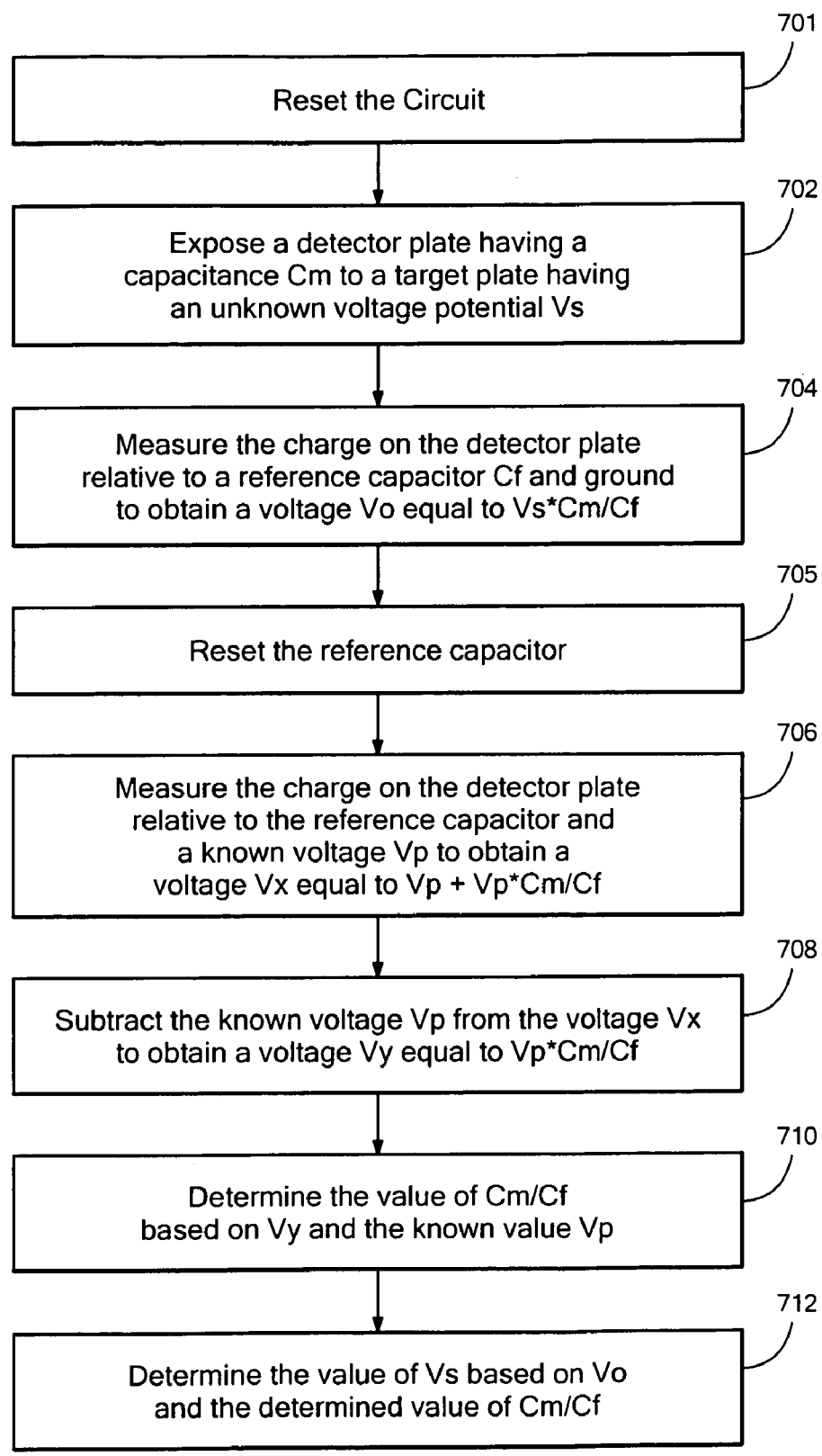
FIG. 7 is a logic flow diagram describing a method for measuring an unknown voltage using a multi-sampling technique in accordance with an embodiment of the present invention.

FIG. 7 is a logic flow diagram describing a method 700 for measuring an unknown voltage using a multi-sampling technique in accordance with an embodiment of the present invention. In block 701, the circuit is reset. In block 702, a detector plate having a capacitance Cm is exposed to a target plate having an unknown voltage potential Vs. In block 704, the induced charge on the detector plate is measured relative to a reference capacitor Cf and ground to obtain a voltage Vo equal to Vs*Cm/Cf. In block 705, the reference capacitor is reset with the detector plate still exposed to the target plate. In block 706, the charge on the detector plate is measured relative to the reference capacitor and a known voltage Vp to obtain a voltage Vx equal to Vp+Vp*Cm/Cf. In block 708, the known voltage Vp is subtracted from the voltage Vx to obtain a voltage Vy equal to Vp*Cm/Cf. In block 710, the value of Cm/Cf is determined based on Vy and the known value Vp. In block 712, the value of Vs is determined based on Vo and the determined value of Cm/Cf.

Improved Non-Contact Voltmeter Architecture #2: Parallel Ref Capacitor

Figure 8:
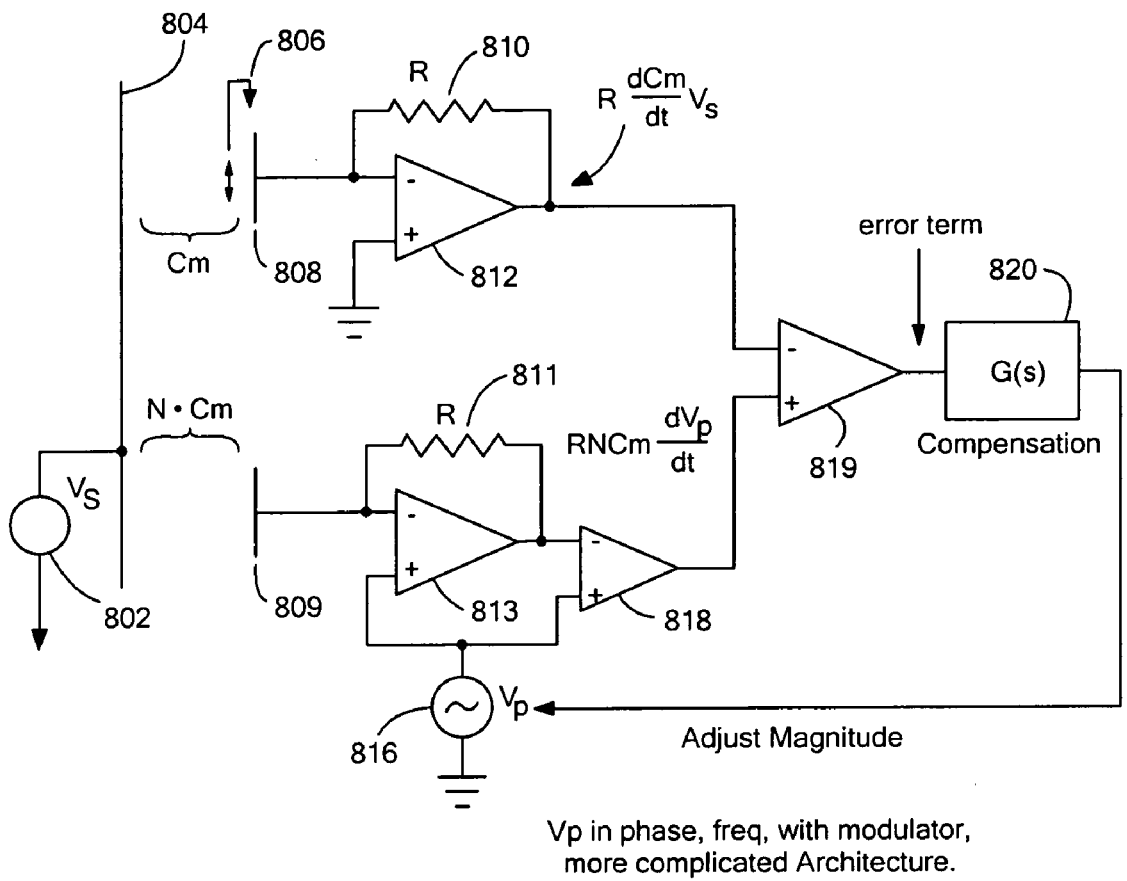
FIG. 8 is a schematic diagram showing the relevant components of an exemplary architecture for a non-contact voltmeter with a parallel reference capacitor in accordance with an embodiment of the present invention.

FIG. 8 is a schematic diagram showing the relevant components of an exemplary architecture for a non-contact voltmeter 800 with a parallel reference capacitor in accordance with an embodiment of the present invention. Among other things, the voltmeter 800 includes a nominal modulation capacitance circuit, a parallel reference capacitance circuit, a difference amplifier 819, and a controller 820. The nominal modulation capacitance circuit includes a movable shutter 806, a detector plate 808, a reference resistor 810, and a charge amplifier 812, with the detector plate 808 coupled to a first charge amplifier input, the reference resistor 810 coupled in parallel to the charge amplifier 812 between the first charge amplifier input and the charge amplifier output, and a second charge amplifier input tied to ground. The parallel capacitance circuit includes a detector plate 809 that is N times the size of the detector plate 808, a reference resistor 811, a charge amplifier 813, a voltage source (Vp) 816, and a difference amplifier 818, with the detector plate 809 coupled to a first charge amplifier input, the reference resistor 811 coupled in parallel to the charge amplifier 813 between the first charge amplifier input and the charge amplifier output, a second charge amplifier input tied to the voltage source 816, and the difference amplifier 818 coupled to receive as inputs the output of the charge amplifier 813 and the voltage source 816. The difference amplifier 819 is coupled to receive as inputs the output of the charge amplifier 812 and the output of the difference amplifier 818. The controller 820 is coupled to receive the output of the difference amplifier 819 and to control the voltage source 816, among other things.

In order to measure a voltage (Vs) 802 on a target surface 804, the shutter 806 is modulated at a predetermined frequency such that the output of the charge amplifier 812 is equal to R*Vs*dCm/dt. At the same time, the voltage source 816 is applied in phase and frequency with the modulation of the shutter 806 such that the output of the difference amplifier 818 is equal to R*N*Cm*dVp/dt. The difference amplifier outputs the difference between the values R*Vs*dCm/dt and R*N*Cm*dVp/dt, and the controller 820 adjusts the magnitude of the voltage source 816 until the two values are equal and cancel out one another at the output of the difference amplifier 819. Using standard servo techniques, the controller 820 can determine Vs based on the known quantities Vp and N. As with the embodiment shown and described with reference to FIG. 6 above, this is once again free of absolute physical scaling.

It should be noted that, while the embodiment described above uses resistors in the nominal and parallel circuits, capacitors could alternatively be used.

Figure 9:
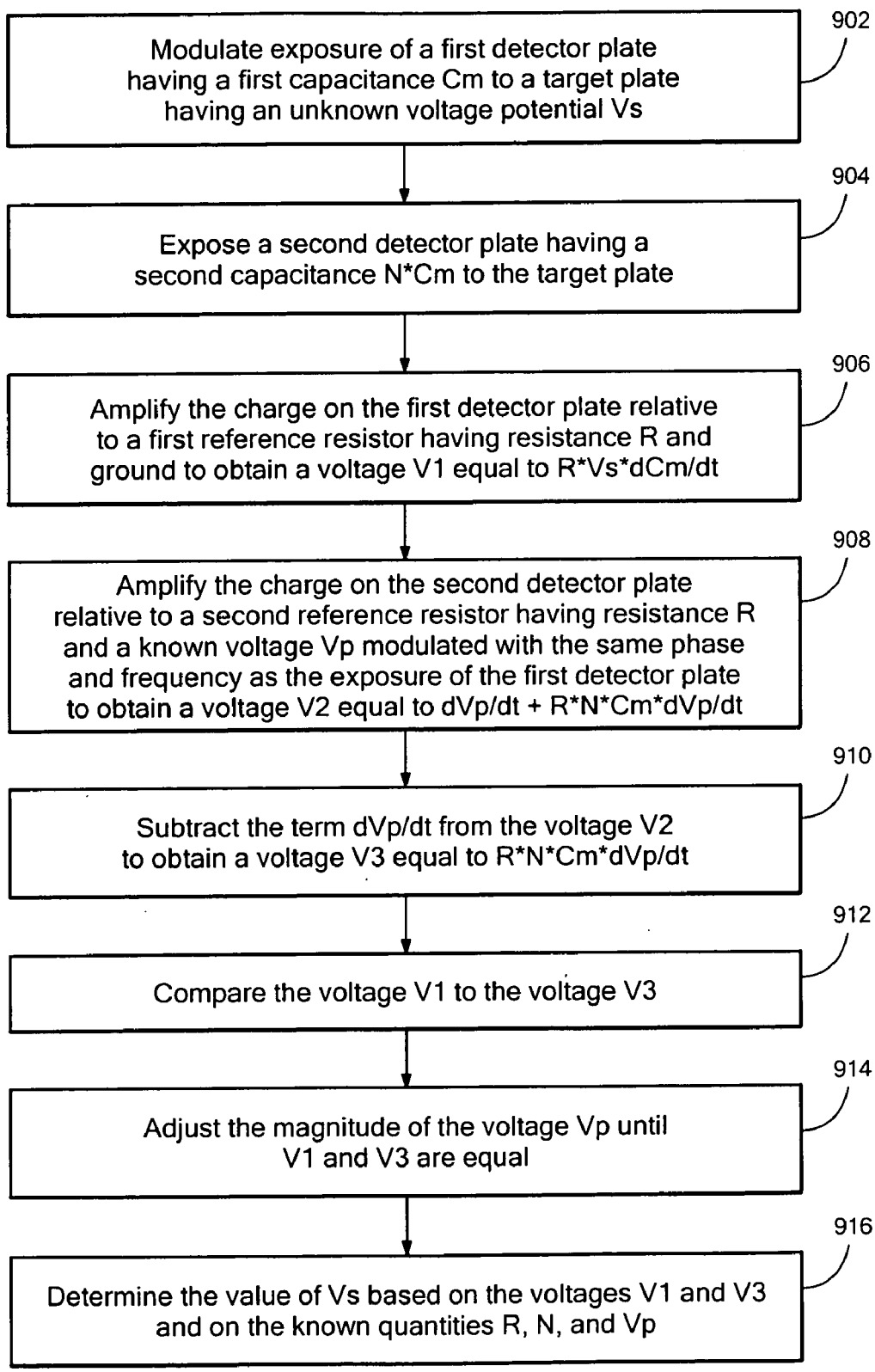
FIG. 9 is a logic flow diagram describing a method for measuring an unknown voltage using a parallel reference capacitor in accordance with an embodiment of the present invention.

FIG. 9 is a logic flow diagram describing a method 900 for measuring an unknown voltage using a parallel reference capacitor in accordance with an embodiment of the present invention. In block 902, exposure of a first detector plate having a first capacitance Cm to a target plate having an unknown voltage potential Vs is modulated at a predetermined phase and frequency. In block 904, a second detector plate having a second capacitance N*Cm is exposed to the target plate. In block 906, the charge on the first detector plate is amplified relative to a first reference resistor having resistance R and ground to obtain a voltage V1 equal to R*Vs*dCm/dt. In block 908, the charge on the second detector plate is amplified relative to a second reference resistor having resistance R and a known voltage Vp modulated with the same phase and frequency as the exposure of the first detector plate to obtain a voltage V2 equal to dVp/dt+R*N*Cm*dVp/dt. In block 910, the term dVp/dt is subtracted from the voltage V2 to obtain a voltage V3 equal to R*N*Cm*dVp/dt. In block 912, the voltage V1 is compared to the voltage V3. In block 914, the magnitude of the voltage Vp is adjusted until V1 and V3 are equal. In block 916, the value of Vs is determined based on the voltages V1 and V3 and on the known quantities R, N, and Vp.

One benefit of this parallel architecture compared to the multi-sampling approach is that it is faster, although the absolute capacitance Cm must be controlled with respect to the reference capacitor, which results in either greater circuit complexity or scaling sensitivity.

Although the above discussion discloses various exemplary embodiments of the invention, it should be apparent that those skilled in the art can make various modifications that will achieve some of the advantages of the invention without departing from the true scope of the invention.

What is claimed is:

1. A voltmeter for measuring an unknown voltage Vs on a target surface without contacting the target surface, the voltmeter comprising:
   a voltage measuring circuit having a detector plate forming a capacitance Cm with the target surface; and
   a movable shutter for selectively exposing the detector plate to the target surface, wherein the voltage measuring circuit (1) measures, in a first sampling stage, a charge Vs*B, where B is proportional to Cm; (2) measures, in a second sampling stage, a charge Vp*B, where Vp is a known voltage introduced by the voltage measuring circuit; (3) determines the value B based on the known voltage Vp; and (4) determines the value Vs based on the determined value B, and wherein the shutter is placed in a closed position substantially blocking the detector plate from the target surface for resetting the voltage measuring circuit prior to measuring the charge Vs*B and the shutter is moved into an opened position exposing the detector plate to the target surface for measuring the charges Vs*B and Vp*B.

2. A voltmeter according to claim 1, wherein the voltage measuring circuit further comprises:
   a voltage source having a voltage Vp;
   a charge amplifier having a first input coupled to the detector plate, a second input that can be selectively coupled to one of ground and the voltage source, and an output;
   a reference capacitor having a capacitance Cf coupled between the first input of the charge amplifier and the output of the charge amplifier;
   a difference amplifier having a first input coupled to the output of the charge amplifier, a second input coupled to the voltage source, and an output; and
   a controller coupled to the output of the charge amplifier, the output of the difference amplifier, and the shutter, wherein:
   in the first sampling stage, with the shutter in the closed position, the voltage measuring circuit reset, and the second charge amplifier input switched to ground, the controller causes the shutter to be moved into the opened position and measures the output Vo of the charge amplifier, which is equal Vs*Cm/Cf; and
   in the second sampling stage, with the shutter still in the opened position, the reference capacitor reset, and the second charge amplifier input switched to the voltage source, the controller measures the output Vy of the difference amplifier, which is equal to Vp*Cm/Cf; and
   the controller determines the quantity Cm/Cf based on Vy and the known quantity Vp and determines the value of Vs based on Vo and the determined quantity Cm/Cf.

3. A voltmeter according to claim 2, wherein the controller includes a sample and hold circuit for measuring and storing Vo.

4. A voltmeter according to claim 2, wherein the voltage source produces a DC voltage.

5. A voltmeter according to claim 2, wherein the voltage source produces an AC voltage, and wherein the controller includes a demodulator to demodulate the varying signal output by the difference amplifier during the second sampling stage.

6. A voltmeter according to claim 2, wherein the voltage measuring circuit further comprises:
   a reset switch coupled in parallel with the reference capacitor.

7. A voltmeter according to claim 6, wherein the controller resets the reference capacitor using the reset switch before exposing the detector plate to the target surface.

8. A voltmeter according to claim 6, wherein the controller resets the reference capacitor using the reset switch between the first and second sampling stages.

9. A voltmeter according to claim 1, wherein the shutter and the detector plate are formed on a common substrate.

10. A method for measuring an unknown voltage Vs on a target surface, the method comprising:
    resetting a voltage measuring circuit with a shutter in a closed position so as to substantially block a detector plate of the voltage measuring circuit from exposure to the target surface;
    a moving the shutter into an opened position so as to expose the detector plate with a capacitance of Cm to the target surface;
    measuring a charge Vs*B using the detector plate, where B is proportional to Cm;
    measuring a charge Vp*B with the shutter still in the opened position, where Vp is a known voltage;
    determining the value of B based on the known voltage Vp; and
    determining the value of Vs based on the determined value B.

11. A method according to claim 10, wherein measuring a charge Vs*B using the detector plate comprises measuring the induced charge on the detector plate relative to a reference capacitor with capacitance Cf and ground to obtain a voltage Vo equal to Vs*Cm/Cf, and wherein measuring a charge Vp*B comprises measuring the charge on the detector plate relative to the reference capacitor and a known voltage Vp to obtain a voltage Vy equal to Vp*Cm/Cf.

12. A method according to claim 11, wherein measuring the charge on the detector plate to obtain the voltage Vy comprises:
    measuring the charge on the detector plate relative to the reference capacitor and the known voltage Vp to obtain an intermediate voltage Vx equal to Vp+Vp*Cm/Cf; and
    subtracting the known voltage Vp from the voltage Vx to obtain Vy.

13. A method according to claim 11, further comprising:
    resetting the reference capacitor before exposing the detector plate to the target surface.

14. A method according to claim 11, further comprising:
    resetting the reference capacitor between (1) measuring the induced charge on the detector plate relative to a reference capacitor Cf and ground and (2) measuring the charge on the detector plate relative to the reference capacitor and a known voltage Vp.

15. A method according to claim 10, wherein exposing the detector plate to the target surface comprises:
    retracting a shutter from between the detector plate and the target surface.

16. A method according to claim 15, wherein the shutter and the detector plate are formed on a common substrate.

17. A voltmeter for measuring an unknown voltage Vs on a target surface without contacting the target surface, the voltmeter comprising:
    a voltage measuring circuit having a first detector plate forming a capacitance Cm with the target surface and a second detector plate forming a capacitance N*Cm with the target surface, where N is a known constant representing that the second detector plate is N times the size of the first detector plate; and
    a movable shutter for modulating exposure of the first detector plate to the target surface, wherein the voltage measuring circuit comprises:
    a nominal modulation capacitance circuit for measuring a first charge proportional to Vs*dCm/dt using the first detector plate;
    a parallel capacitance circuit for measuring a second charge proportional to N*Cm*dVp/dt using the second detector plate, where Vp is a known voltage modulated in phase and frequency with the modulated exposure of the first detector plate;

a comparison circuit for comparing the first and second charges; and a controller for adjusting the magnitude of Vp based on the comparison circuit until the first and second charges are equal and determining Vs based on the voltage Vp.

18. A voltmeter according to claim 17, wherein:

the nominal modulation capacitance circuit further includes a first reference resistor having a resistance value R and a first charge amplifier, the first detector plate coupled to one input of the first charge amplifier, the first reference resistor coupled in parallel to the charge amplifier between said one input of the first charge amplifier and an output of the first charge amplifier, and another input of the first charge amplifier tied to ground;

the parallel reference capacitance circuit further includes a second reference resistor also having a resistance value R, a second charge amplifier, a voltage source (Vp), and a first difference amplifier, the second detector plate coupled to one input of the second charge amplifier, the second reference resistor coupled in parallel to the second charge amplifier between said one input of the second charge-amplifier and output of the second charge amplifier, another input of the second charge amplifier tied to the voltage source, and the first difference amplifier coupled to receive as inputs the output of the second charge amplifier and the voltage source; and the comparison circuit includes a second difference amplifier having a first input coupled to the output of the first charge amplifier and a second input coupled to the output of the first difference amplifier, wherein:

the controller causes the shutter to be modulated at a predetermined frequency such that the output of the first charge amplifier is equal to $R*Vs*dCm/dt$;

the controller causes the voltage source to output a predetermined voltage Vp in phase and frequency with the modulation of the shutter such that the output of the first difference amplifier is equal to $R*N*Cm*dVp/dt$ and the output of the second difference amplifier is equal to the difference between the values $R*Vs*dCm/dt$ and $R*N*Cm*dVp/dt$;

the controller adjusts the magnitude of the voltage source until the output of the second difference amplifier is null; and the controller determines Vs based on the known quantities Vp and N, where Vs is equal to $Vp*N$.

19. A voltmeter according to claim 17, wherein the shutter and the detector plates are formed on a common substrate.

* * * * *

UNITED STATES PATENT AND TRADEMARK OFFICE
CERTIFICATE OF CORRECTION

PATENT NO.        : 7,098,644 B1                                              Page 1 of 1
APPLICATION NO.   : 11/086976
DATED             : August 29, 2006
INVENTOR(S)       : Timothy J. Denison It is certified that error appears in the above-identified patent and that said Letters Patent is hereby corrected as shown below:

Col. 10, line 5
  replace "a moving"
  with --moving--.

Col. 11, line 24
  replace "charge-amplifier"
  with --charge amplifier--.

Signed and Sealed this

Fifth Day of December, 2006

JON W. DUDAS
*Director of the United States Patent and Trademark Office*